United States Patent
Guo

(10) Patent No.: US 9,275,713 B2
(45) Date of Patent: Mar. 1, 2016

(54) MAGNETORESISTIVE ELEMENT AND METHOD OF MANUFACTURING THE SAME

(71) Applicant: Yimin Guo, San Jose, CA (US)

(72) Inventor: Yimin Guo, San Jose, CA (US)

(*) Notice: Subject to any disclaimer, the term of this patent is extended or adjusted under 35 U.S.C. 154(b) by 0 days.

(21) Appl. No.: 14/157,493

(22) Filed: Jan. 16, 2014

(65) Prior Publication Data

US 2014/0198564 A1 Jul. 17, 2014

Related U.S. Application Data

(60) Provisional application No. 61/753,734, filed on Jan. 17, 2013.

(51) Int. Cl.
| | |
|---|---|
| *G11C 11/00* | (2006.01) |
| *G11C 11/16* | (2006.01) |
| *H01L 43/12* | (2006.01) |
| *H01L 43/08* | (2006.01) |
| *H01L 27/22* | (2006.01) |

(52) U.S. Cl.
CPC .............. *G11C 11/161* (2013.01); *G11C 11/00* (2013.01); *G11C 11/16* (2013.01); *G11C 11/1673* (2013.01); *H01L 27/228* (2013.01); *H01L 43/08* (2013.01); *H01L 43/12* (2013.01)

(58) Field of Classification Search
CPC ..... G11C 11/1673; G11C 11/00; G11C 11/16
USPC .................................. 365/148, 158, 171, 173
See application file for complete search history.

(56) References Cited

U.S. PATENT DOCUMENTS

| | | | | |
|---|---|---|---|---|
| 6,826,076 | B2* | 11/2004 | Asano | G11C 11/16 365/100 |
| 9,099,188 | B2* | 8/2015 | Guo | G11C 11/1673 |
| 2014/0203341 | A1* | 7/2014 | Guo | H01L 27/1159 257/295 |
| 2014/0246741 | A1* | 9/2014 | Guo | H01L 43/08 257/421 |

* cited by examiner

*Primary Examiner* — Gene Auduong
(74) *Attorney, Agent, or Firm* — 5Suns; Yuanhui Huang

(57) ABSTRACT

A planar STT-MRAM comprises apparatus, a method of operating and a method of manufacturing a spin-torque magnetoresistive memory and a plurality of magnetoresistive memory element having a ferromagnetic recording layer forming a flux closure with a self-aligned ferromagnetic soft adjacent layer which has an electric field enhanced perpendicular anisotropy through an interface interaction with a dielectric functional layer. The energy switch barrier of the soft adjacent layer is reduced under an electric field along a perpendicular direction with a proper voltage on a digital line from a control circuitry; accordingly, the in-plane magnetization of the recording layer is readily reversible in a low spin-transfer switching current.

17 Claims, 6 Drawing Sheets

MAGNETORESISTIVE ELEMENT AND METHOD OF MANUFACTURING THE SAME

RELATED APPLICATIONS

This application claims the priority benefit of U.S. Provisional Application No. 61/753,734, filed Jan. 17, 2013, which is incorporated herein by reference.

BACKGROUND OF THE INVENTION

1. Field of the Invention

This invention relates generally to a spin-transfer-torque magnetic-random-access memory (MRAM) element and a method of manufacturing the same magnetoresistive element, more particularly to structures and methods of reading and programming a spin-torque magnetoresistive random access memory (MRAM) element having an electric field switched soft magnetic adjacent layer.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

There has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller. Accordingly, this method is expected to be capable to achieve both device miniaturization and lower currents. In another word, STT-MRAM having high speed, large capacities and low-power-consumption operations can potentially replace the conventional semiconductor memory used in electronic chips, especially mobile chips for power saving and non-volatility.

Besides a write current, the stability of the magnetic orientation in a MRAM cell as another critical parameter has to be kept high enough for a good data retention, and is typically characterized by the so-called thermal factor which is proportional to the anisotropy as well as the volume of the recording layer cell size.

In a simple configuration, the so-called planar STT-MRAM, the recording layer of each MTJ element is designed to have stable magnetic states with magnetization in the film plane. In-plane devices typically have their magnetic easy axis defined by the in-plane shape of the free layer, or the shape anisotropy. To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, STT-MRAM has the potential to scale nicely at even the most advanced technology nodes. However, patterning of small MTJ element leads to increasing variability in MTJ resistance and sustaining relatively high switching current or recording voltage variation in a STT-MRAM.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

Thus, it is desirable to provide STT-MRAM structures and methods that realize highly-accurate reading, highly-reliable recording and low power consumption while suppressing destruction and reduction of life of MTJ memory device due to recording in a nonvolatile memory that performs recording resistance changes, and maintaining a high thermal factor for a good data retention.

BRIEF SUMMARY OF THE PRESENT INVENTION

The present invention comprises a magnetoresistive element having a ferromagnetic soft adjacent layer forming a flux closure with the recording layer and a dielectric functional layer serving as a control of the soft adjacent layer for a low power spin-transfer-torque MRAM. The magnetoresistive element in the invention has three terminals: an upper electrode connected to a bit line, a middle electrode connected to a select transistor and a digital line as a bottom electrode wherein an MTJ stack is sandwiched between an upper electrode and a middle electrode, a functional layer and a soft adjacent layer are sandwiched between a middle electrode and a digital line of each MRAM memory cell, which also comprises a write circuit which supplies a voltage drop or electric field on a functional layer and bi-directionally supplies a spin polarized current to the magnetoresistive element.

An exemplary embodiment includes method of operating a spin-transfer-torque magnetoresistive memory including a circuitry coupled to the bit line positioned adjacent to selected ones of the plurality of magnetoresistive memory elements and coupled to the digital line configured to generate a magnetic field acting on the soft adjacent layer and an electric field pointing into the top surface of the functional layer and accordingly increase the perpendicular anisotropy strength and reverse the magnetization in the soft adjacent layer. Thus a low write current is readily achieved due to the additive effects of the spin-transfer torque and a demag field from the soft adjacent layer during a recording process.

Another exemplary embodiment includes method of operating a spin-transfer-torque magnetoresistive memory including a circuitry coupled to the bit line positioned adjacent to selected ones of the plurality of magnetoresistive memory elements and coupled to the digital line configured to generating a strong electric field pointing down into the top surface of the functional layer and accordingly enhance the perpendicular anisotropy strength and obtain a perpendicular magnetization in the soft adjacent layer. Thus a low write current is readily achieved by the spin-transfer write current during a recording process.

The present invention further comprises a method of manufacturing a magnetoresistive memory element comprising a self-align processing procedure to make a ferromagnetic soft adjacent layer and the recording layer having overlaid oval-shaped in-plane dimensions and forming a flux closure for a high thermal factor and good data retention.

Various embodiments will be described hereinafter with reference to the companying drawings. The drawings are schematic or conceptual, and the relationships between the thickness and width of portions, the proportional coefficients of sizes among portions, etc., are not necessarily the same as the actual values thereof.

DETAILED DESCRIPTION OF THE INVENTION

Figure 1:
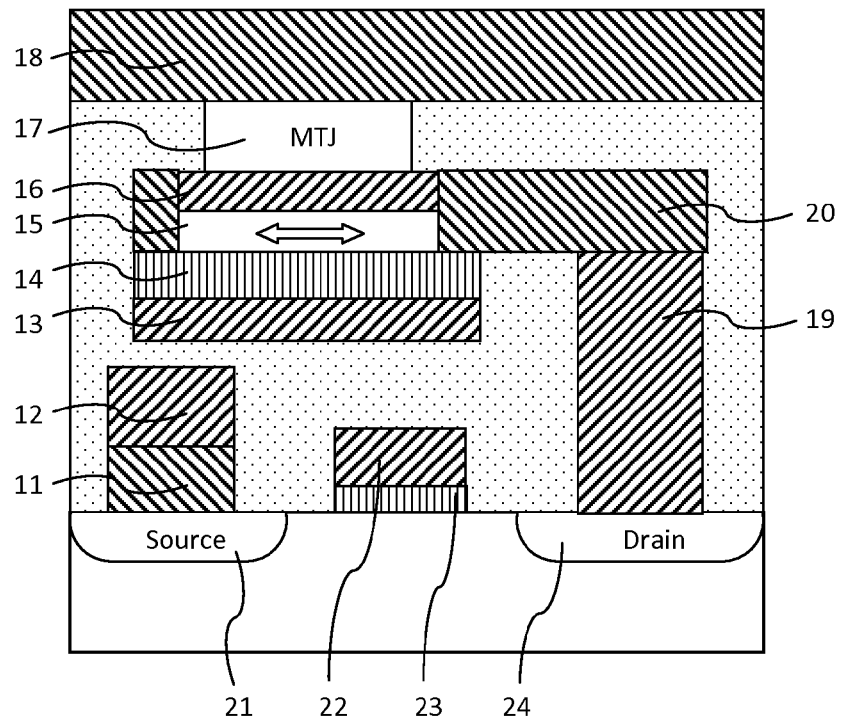
FIG. 1 is an exemplary cross-section of one memory cell in a STT-MRAM array according to an embodiment.

In general, according to each embodiment, there is provided a magnetoresistive memory cell comprising:

a digital line provided on a surface of a substrate serving as a bottom electrode;

a dielectric functional layer provided on the top surface of the digital line layer;

a magnetic soft adjacent layer provided on the top surface of the dielectric functional layer having a magnetic shape anisotropy in a surface plane and a interface interaction induced perpendicular anisotropy and having a variable magnetization direction;

a conductive layer provided on the top surface of the soft adjacent layer, serving as a middle electrode;

an MTJ stack provided on the top surface of the conductive layer;

a bit line provided on the top surface of the MTJ stack;

a CMOS transistor coupled the plurality of magnetoresistive memory elements through the middle electrode.

The MTJ stack comprises:

a recording layer provided on the top surface of the conductive layer having a magnetic shape anisotropy in a surface plane and having a variable magnetization direction;

a tunnel barrier layer provided on the top surface of the recording;

a reference layer on the top surface of the tunnel barrier layer having magnetic anisotropy and invariable magnetization direction in a surface plane;

a coupling spacing layer on the top surface of the reference layer;

a pinned layer on the top surface of the coupling spacing layer having magnetic anisotropy and invariable magnetization direction in a surface plane;

an antiferromagnetic layer on the top surface of the pinned layer;

a cap layer on the top surface of the antiferromagentic layer.

There is further provided circuitry connected to the bit line, the digital line and the select transistor of each magnetoresistive memory cell.

The magnetic soft adjacent layer and the recording layer have overlaid in-plane oval-shape dimensions and magnetostatic anti-parallel coupling, forming a flux closure state along their long axis directions. This provides a much improved thermal stability than a single recording layer having the same in-plane shape, accordingly, achieving a high thermal factor or good data retention, and high density planar STT MRAM array.

A dielectric functional layer is made of a metal oxide (or nitride, chloride) layer having a naturally stable rocksalt crystal structure having the (100) plane parallel to the substrate plane and with lattice parameter along its {110} direction being larger than the bcc(body-centered cubic)-phase Co lattice parameter along {100} direction. As an amorphous ferromagnetic material, like CoFeB, in the magnetic soft adjacent layer is thermally annealed, a crystallization process occurs to form bcc CoFe grains having epitaxial growth with (100) plane parallel to surface of the rocksalt crystal functional layer.

In a rocksalt crystal structure of a functional layer, such as MgO, two fcc sublattices for metal atoms and O atoms, each displaced with respect to the other by half lattice parameter along the [100] direction. However, at a surface, O atoms protrude while metal atoms retreat slightly from the surface, forming a strong interface interaction with the bcc CoFe grains. Accordingly, a perpendicular anisotropy is induced in the soft adjacent layer, as a result of the strong interface interaction between the soft adjacent layer and the functional layer. As the thickness of a soft adjacent layer is getting larger, the interface interaction induced perpendicular anisotropy is getting smaller. Once it is not enough to overpower the film demagnetization, the magnetization direction of the soft adjacent layer remains in a film plane.

Further, as an electric field is applied on the functional layer and perpendicular to the surface, the negative charged O atoms and positive charged metal atoms at surface are pulled toward opposite directions and modify the interface interaction between the bcc CoFe grains in the soft adjacent layer and the rocksalt crystal grains in the functional layer. When an electric field points down towards the top surface of a functional layer, O atoms protrude more from the surface and form a stronger interface interaction with the bcc CoFe grains, causing an enhanced perpendicular anisotropy, and vice versa. This mechanism is utilized hereafter to manipulate the perpendicular anisotropy strength and magnetization direction of the soft adjacent layer through applying an electric field on the dielectric functional layer.

An exemplary embodiment includes method of operating a spin-transfer-torque magnetoresistive memory including a circuitry coupled to the bit line positioned adjacent to selected ones of the plurality of magnetoresistive memory elements and coupled to the digital line configured to generate a magnetic field acting on the soft adjacent layer and an electric field pointing into the top surface of the functional layer and accordingly increase the perpendicular anisotropy strength and reverse the magnetization in the soft adjacent layer. Thus a low write current is readily achieved due to the additive effects of the spin-transfer torque and a demag field from the soft adjacent layer during a recording process.

Another exemplary embodiment includes method of operating a spin-transfer-torque magnetoresistive memory including a circuitry coupled to the bit line positioned adjacent to selected ones of the plurality of magnetoresistive memory elements and coupled to the digital line configured to generating a strong electric field pointing down into the top surface of the functional layer and accordingly enhance the perpendicular anisotropy strength and obtain a perpendicular magnetization in the soft adjacent layer. Thus a low write current is readily achieved by the spin-transfer write current during a recording process.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

FIG. 1 is an exemplary cross-section of a magnetoresistive memory cell 10 in a STT-MRAM array according to an embodiment. The magnetoresistive memory cell 10 is configured by a bit line 18, an MTJ stack 17, a conductive layer 16, a soft adjacent layer 15, a dielectric functional layer 14, a digital line 13, and a select transistor comprising an interconnect layer 12, a source contact 11, drain contact 19, a middle electrode 20, source region 21, a gate insulating film 22, a gate electrode 23 and a drain region 24.

FIG. 2(A, B) illustrate a magnetoresistive element 50 in the first embodiment of the method of operating a spin-transfer-torque magnetoresistive memory. A circuitry, which is not shown here, is coupled to the bit line for providing a bi-directional recording current between the bit line and the middle electrode connecting to the select transistor, and is coupled to the digital line for providing an electric field on the dielectric functional between the digital line and the middle electrode. The magnetoresistive element 50 comprises: a bit line 18, an MTJ stack 17, a conductive layer 16, a soft adjacent layer 15, a dielectric functional layer 14, a digital line 13, a drain contact 19, a middle electrode 20. The MTJ stack comprises: a seed layer 17a, a recording layer 17b, a tunnel barrier layer 17c, a reference layer 17d, a coupling spacing layer 17e, a pinned layer 17f, an anti-ferromagnetic layer 17g and a cap layer 17h, in the order from the bottom.

The recording layer 17b and reference layer 17d each are made of a ferromagnetic material, and have uni-axial magnetic anisotropy in a film surfaces. The tunnel barrier layer 17c is made of a thin metal oxide, such as MgO, forming a thin tunneling junction magnetoresistance between the recording layer and the reference layer.

The recording layer 17b has a variable (reversible) magnetization direction. The antiferromagnetic pinning layer 17g is above and in contact with the pinned ferromagnetic layer 17f. The ferromagnetic reference and pinned layers (17d, 17f) each have a magnetic moment vector that are usually held anti-parallel by the coupling spacer layer 17e and held in a fixed long axis direction by the antiferromagnetic pinning layer. Thus the magnetic moment vector of fixed reference layer 17d is not free to rotate and is used as a reference. The coupling layer is typically one that exhibits the oscillatory coupling phenomenon, for example, at least one of the elements Ru, Os, Re, Cr, Rh, Cu, or their combinations, with a thickness chosen for strong anti-parallel coupling. The antiferromagnetic pinning layer, may comprise materials such as PtMn, IrMn, PdMn, or combinations thereof.

An example configuration of the MTJ element 50 will be described below. In the MTJ stack, the seed layer 17a is Ru (2 nm), the recording layer 17b is CoFeB (2 nm)/CoFe (0.5 nm), the tunnel barrier layer 17c is MgO (1 nm), the reference layer 17d is CoFe (2 nm), the coupling spacing layer 17e is Ru (0.8 nm), the pinned layer 17f is CoFe (2 nm), the anti-ferromagnetic layer 17g is PtMn (20 nm) and the cap layer 17h is Ru (10 nm). The conductive layer 16 is made of Ta (2 nm)/Ru (3 nm)/MgO (0.8 nm). The soft adjacent layer 15 is made of CoFeB (2.5 nm). The dielectric functional layer 14 is made of MgO (2.5 nm). The digital line 13 is made of Ta (20 nm)/Cu (20 nm)/Ta (20 nm). Each element written in the left side of "/" is stacked above an element written in the right side thereof.

The dielectric functional layer 14 serves to enhance or modify perpendicular magnetic anisotropy of the soft adjacent layer 15. The functional layer 14 is preferred to be made of MgO layer, or other metal oxide (or nitride, chloride) layer which has a rocksalt crystalline as its naturally stable structure thereof will be described later.

The CoFeB (with B content no less than 10%) layer comprised in the soft adjacent layer 15 is formed into an amorphous state as deposited. The MgO layer comprised in the functional layer is formed into rocksalt crystal grains with the (100) plane parallel to the substrate plane. In the rocksalt crystal structure, two fcc sublattices for Mg and O, each displaced with respect to the other by half lattice parameter along the [100] direction. Its lattice parameter along the {110} direction is ranged from 2.98 to 3.02 angstrom, which has slightly larger than bcc CoFe lattice parameter along {100} direction and has a lattice mismatch between 4% and 7%. After thermal annealing with a temperature higher than 250-degree, the amorphous CoFeB is crystallized to form bcc CoFe grains having epitaxial growth with (100) plane parallel to surface of the rocksalt crystal layers with in-plane expansion and out-of-plane contraction. Accordingly, a perpendicular magnetization is induced in the soft adjacent layer from lower interface interaction with the MgO layer. Typically, a perpendicular magnetization may be achieved in a CoFeB layer of a thickness less than 1.5 nm. As the thickness of a soft adjacent layer is getting larger, the interface interaction induced perpendicular anisotropy is getting smaller. Once it is not enough to overpower the film demagnetization, the magnetization direction of the soft adjacent layer remains in a film plane.

Figure 2A:
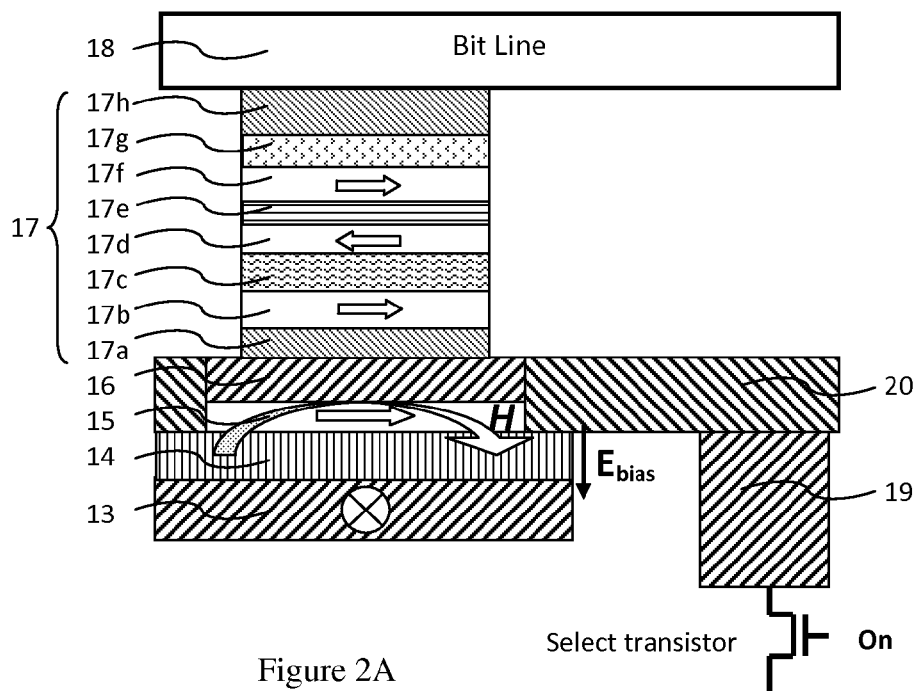
FIG. 2A illustrates a memory element, according to the first recording method of the embodiment, having a downward electric field on a dielectric functional layer by a negative bias voltage pulse through the digital line to increase the perpendicular anisotropy and reverse the magnetization of a soft adjacent layer to the magnetic field direction in accordance with a direction of a current along the digital line.

Since the MgO layer resistance increases exponentially with the thickness, a typical RA of an MTJ stack is preferred to be in the range of 3 to 20 ohm.$\mu m^2$, while the RA of an anisotropy modification layer can be made to be as high as 50K to 1 M ohm.$\mu m^2$, which makes the functional layer a good dielectric layer and the amount of leakage current from a digital line to the MTJ stack is negligible. Applying a negative voltage on the digital line generates an electric field pointing into the top surface of the functional layer and increases the perpendicular anisotropy strength in the soft adjacent layer, accordingly, the magnetization of the soft adjacent layer is readily reversible, or switchable, to the direction of a small external magnetic field, as shown in FIG. 2A. The external magnetic field may be directly generated by a current flowing along the digital line or additional conductive line.

Figure 2B:
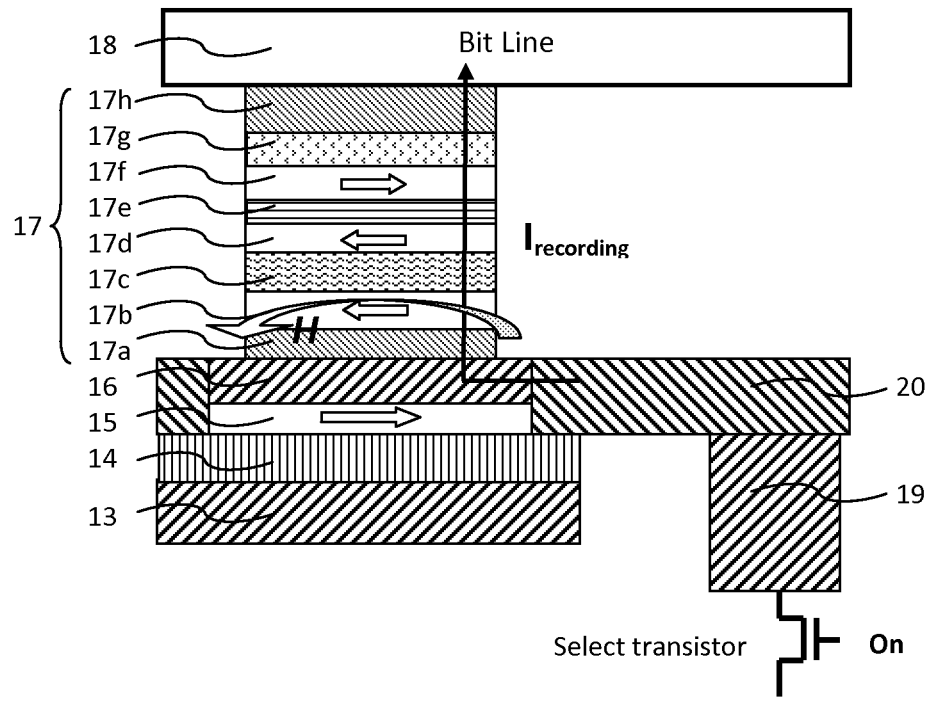
FIG. 2B illustrates a memory element, according to the first recording method of the embodiment, having a demag field generated from the soft adjacent layer to assist the spin-transfer current switching of the recording layer by a recording current through the stacked body along the stack direction.

FIG. 2B illustrates a magnetoresistive element 50 having a spin transfer recording current between the bit line and the select transistor and into the stacked body along the stack direction while the voltage from a digital line is switched off after reversing of the soft adjacent layer magnetization. Thus a low write current is readily achieved due to the additive effects of the spin-transfer torque and a demag field from the soft adjacent layer during a recording process. After a successful data recording, a flux closure between the recording layer and the soft adjacent layer forms again, maintaining a good thermal stability and data retention of the memory cell. As a result, the margins among reading voltage, recording voltage and break-down voltage are improved.

Figure 3A:
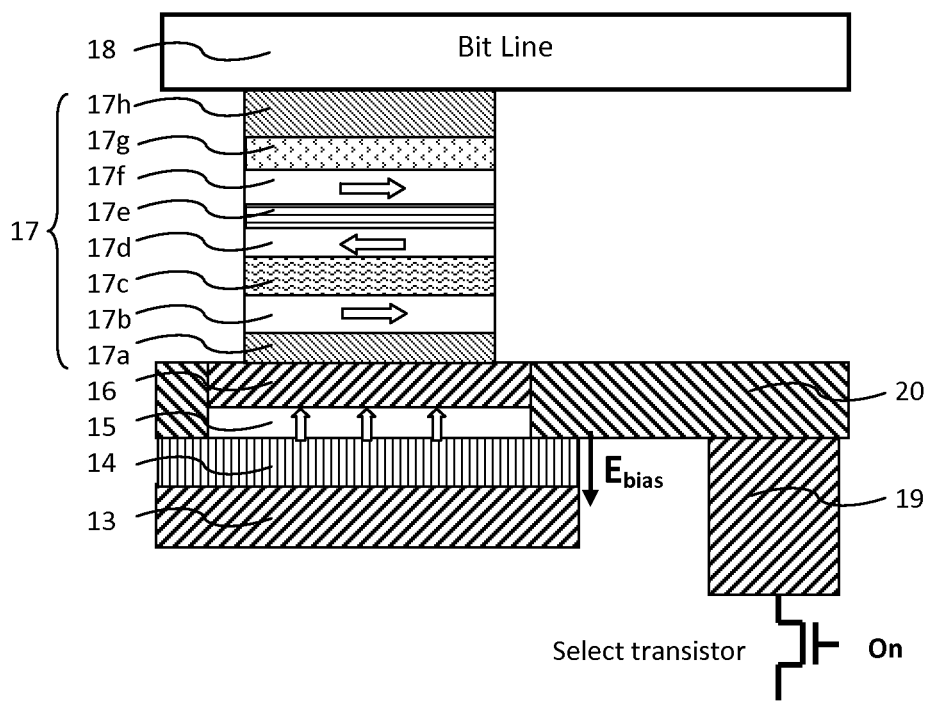
FIG. 3A illustrates a memory element, according to the second recording method of the embodiment, having a downward electric field on a dielectric functional layer by a negative bias voltage pulse through the digital line to increase the perpendicular anisotropy of a soft adjacent layer to have a perpendicular magnetization.

FIGS. 3(A-C) illustrate a magnetoresistive element 50 in the second embodiment of the method of operating a spin-transfer-torque magnetoresistive memory. Applying a negative voltage on the digital line generates a large electric field pointing into the top surface of the functional layer and increases the perpendicular anisotropy strength in the soft adjacent layer to make the magnetization of the soft adjacent layer along a perpendicular direction, as shown in FIG. 3A.

Figure 3B:
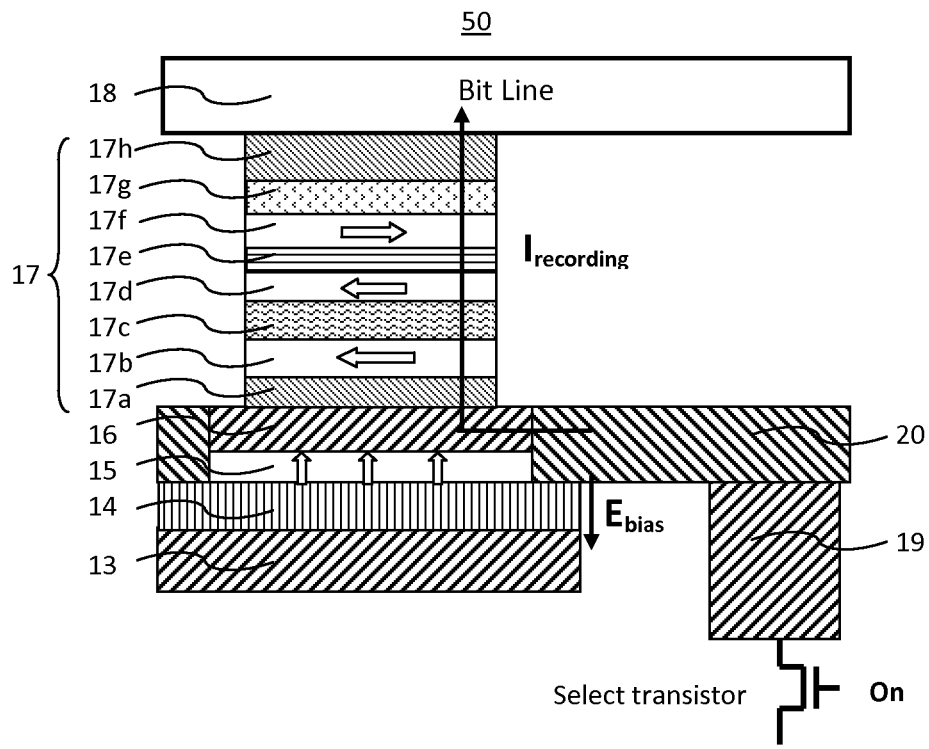
FIG. 3B illustrates a memory element, according to the second recording method of the embodiment, having a recording layer magnetization switchable to the direction in accordance with a direction of a recording spin-transfer current through the bit line into the stacked body along the stack direction.
Figure 3C:
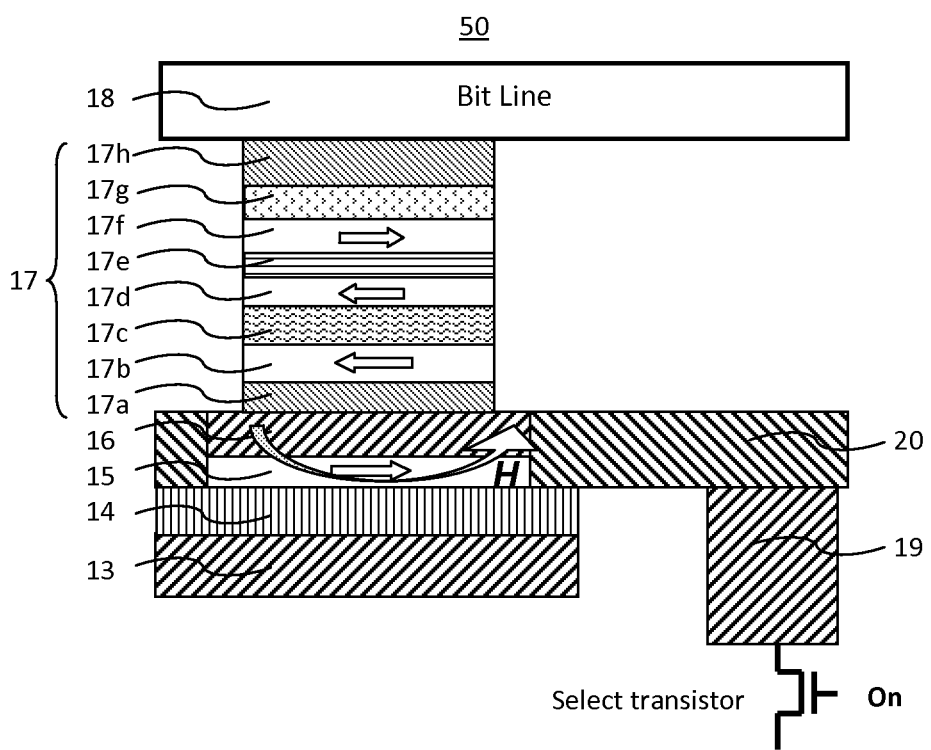
FIG. 3C illustrates a memory element, according to the second recording method of the embodiment, having a demag field generated from the switched recording layer to set the magnetization direction of the soft adjacent layer forming a flux closure.

FIG. 3B illustrates a magnetoresistive element 50 having a spin transfer recording current between the bit line and the select transistor and into the stacked body along the stack direction while the voltage from a digital line is maintained to keep the soft adjacent layer magnetization in a perpendicular direction, breaking the flux closure between magnetizations in the soft adjacent layer and the recording layer. Thus a low write current is readily achieved to reverse the recording layer magnetization. After a successful data recording, a flux closure between the recording layer and the soft adjacent layer is restored again, as shown in FIG. 3C, maintaining a good thermal stability and data retention of the memory cell. As a result, the margins among reading voltage, recording voltage and break-down voltage are improved.

During fabrication of the MRAM array architecture, each succeeding layer is deposited or otherwise formed in sequence and each magnetoresistive element may be defined by selective deposition, photolithography processing, etching, etc. using any of the techniques known in the semiconductor industry. Typically the layers of the MTJ stack are formed by thin-film deposition techniques such as physical vapor deposition, including magnetron sputtering and ion beam deposition, or thermal evaporation. During deposition of at least a portion of the magnetoresistive element, a magnetic field is provided to set a preferred anisotropy easy-axis into the material (induced intrinsic anisotropy). In addition, the MTJ stack is typically annealed at elevated temperature while exposed to a magnetic field directed along the preferred anisotropy easy-axis to further set the intrinsic anisotropy direction and to set the pinning direction when an antiferromagnetic pinning layer is used. In addition to intrinsic anisotropy, memory elements patterned into a shape having aspect ratio greater than one will have a shape anisotropy, and the combination of this shape and the intrinsic anisotropy define an easy axis that is preferably parallel to a long axis of the memory element.

Referring now to FIGS. 4 through 13, a method of manufacturing a magnetoresistive element in an MRAM array according to the embodiment is described. The magnetoresistive element to be manufactured by the manufacturing method according to this embodiment is the magnetoresistive element 10 of the embodiment of FIG. 1.

Figure 4:
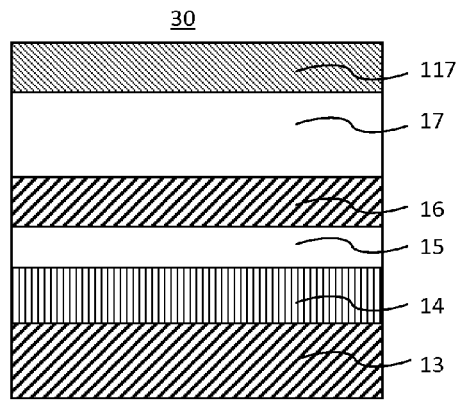
FIG. 4 is a cross-sectional view illustrating a manufacturing method according to the embodiment.

First, as shown in FIG. 4, a magnetoresistive element includes a bottom electrode layer 13, the dielectric functional layer 14, the magnetic soft adjacent layer 15, the conductive layer 16, the MTJ stack 17 and the photoresist hard mask layer, which are sequentially formed on the substrate by sputtering techniques. A patterning is then performed, by using a known lithography technique, down to a bottom surface by anisotropic etching (RIE (Reactive Ion Etching), for example), which is followed by depositing an insulating film made of silicon oxide (SiO$_2$) or silicon nitride (SiN), for example, on the entire surface, then flattened by chemical mechanical polishing (CMP). The bottom electrode serves as a digital line connecting to a control circuitry, not shown here.

Examples of the materials of the recording layer, reference layer and pinned layer are made of ferromagnetic materials consisting at least one element from Co, Fe, Ni, while the soft adjacent layer is a ferromagnetic material alloy containing at least Boron and Co. The conductive layer is a nonmagnetic layer made of Ta or multilayer such as Ta/X or Ta/X/Y, X is selected from Ru, Cu, Ag, Au, Y is a thin metal oxide such as MgO, etc. The functional layer may be a magnesium oxide (MgO) layer, for example. The hard mask layer 117 may be a tantalum (Ta) layer, for example.

Figure 5:
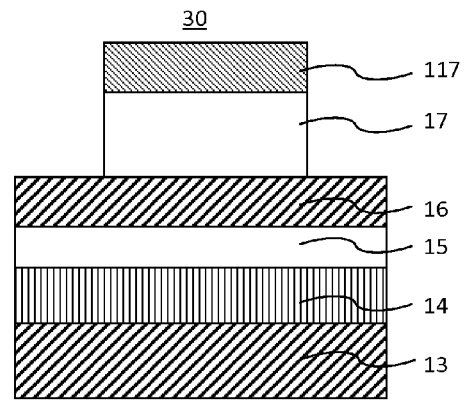
FIG. 5 is a cross-sectional view illustrating a manufacturing method according to the embodiment.

An MTJ stack patterning is then performed by using a known lithography technique or a known etching technique. The MTJ including the recording layer is patterned into an oval-like shape having an aspect ratio greater than one, and this shape anisotropy mainly defines an easy axis parallel to a long axis of the recording layer. A mask (not shown) made of a photoresist is formed on the hard mask layer 117. Using the mask, patterning is performed on the hard mask layer 117 and down to a top Ta surface of the conductive layer 16 by RIE etching (using a gas CH3OH, or a mixed gas CO+NH$_3$, for example), as shown in FIG. 5. Since possible re-deposition of metal atoms on the MTJ side wall could be formed, it's preferred to conduct a sputter etching at varied angle to remove these materials from tunnel barrier layer edges. It should be noted that any residual material from the recording layer may be further oxidized to avoid possible current crowding induced MTJ resistance variation. An optional process includes O ion or N ion implantation into the etched surface.

Figure 6:
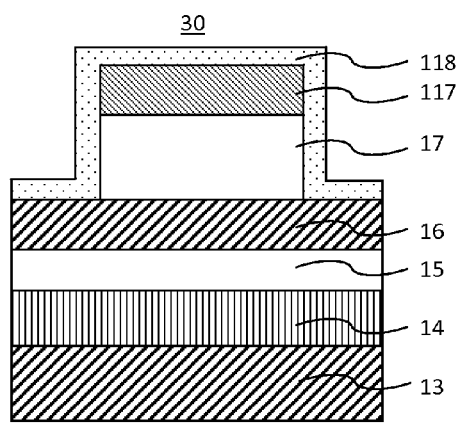
FIG. 6 is a cross-sectional view illustrating a manufacturing method according to the embodiment.

As shown in FIG. 6, an insulating film 118 is then formed to cover the surface of the patterned film consisting of the conductive layer 16, the MTJ stack 17, and the hard mask layer 117.

Figure 7:
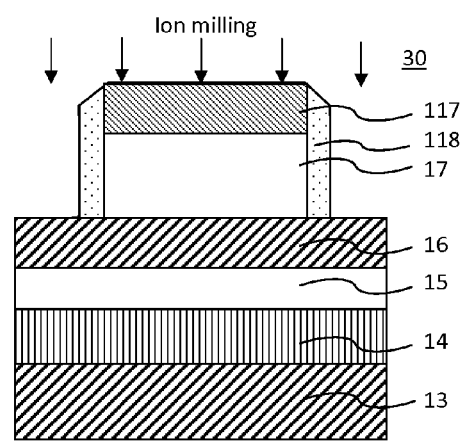
FIG. 7 is a cross-sectional view illustrating a manufacturing method according to the embodiment.
Figure 8:
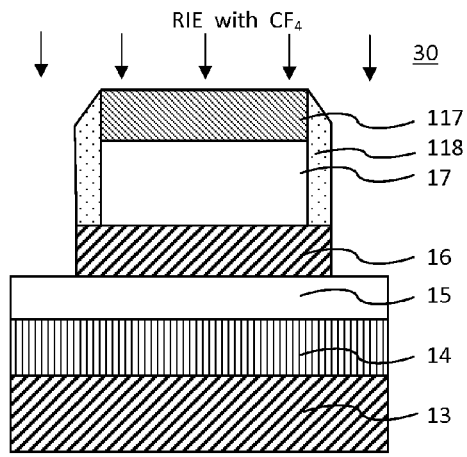
FIG. 8 is a cross-sectional view illustrating a manufacturing method according to the embodiment.
Figure 9:
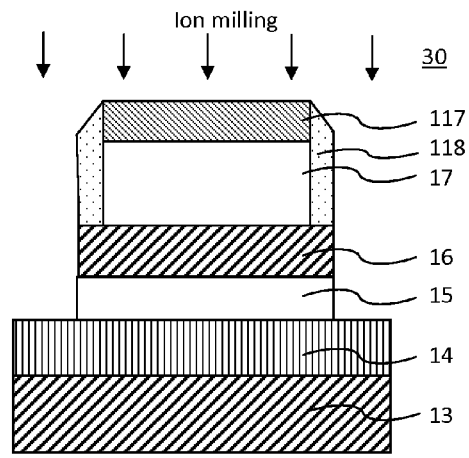
FIG. 9 is a cross-sectional view illustrating a manufacturing method according to the embodiment.

Further an ion milling process having ion beam normal to the substrate surface is conducted to etch away the insulating material on top surface of the conductive layer, as shown in FIG. 7, to form a self-aligning mask comprising a remaining top hard mask and sidewall insulating film. By using the mask, a RIE etching using CF4 gas is performed to remove the Ta conductive layer 16, as shown in FIG. 8. Further an ion milling process is conducted to pattern the soft adjacent layer, as shown in FIG. 9, into an overlaid oval-like shape having slightly larger dimension than MTJ stack and aspect ratio greater than one, and this shape anisotropy mainly defines an easy axis parallel to a long axis of the soft adjacent layer.

Figure 10:
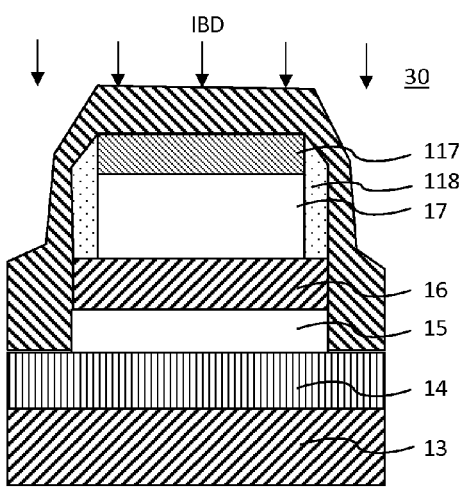
FIG. 10 is a cross-sectional view illustrating a manufacturing method according to the embodiment.
Figure 11:
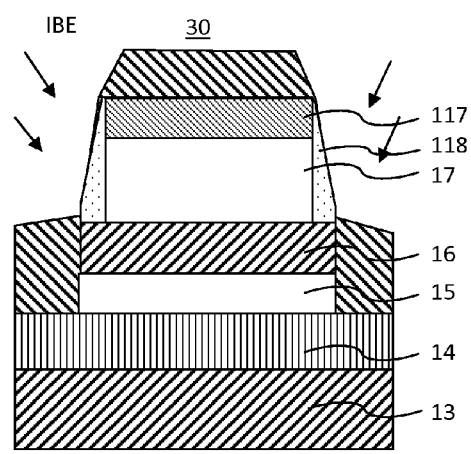
FIG. 11 is a cross-sectional view illustrating a manufacturing method according to the embodiment.
Figure 12:
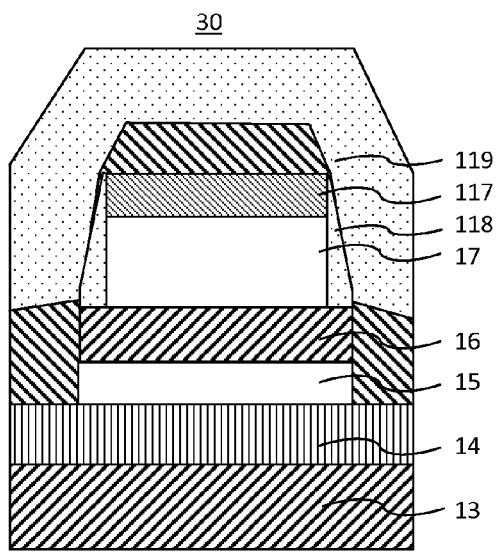
FIG. 12 is a cross-sectional view illustrating a manufacturing method according to the embodiment.
Figure 13:
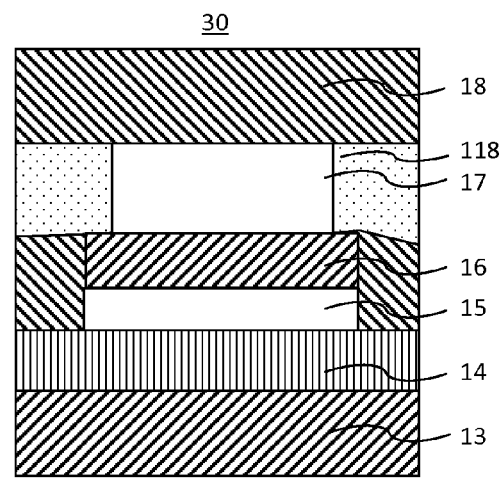
FIG. 13 is a cross-sectional view illustrating a manufacturing method according to the embodiment.

A nonmagnetic metal layer is then deposited by an IBD process having a deposition normal to the substrate surface, as shown in FIG. 10, to form a non-uniform metal covering layer: side wall thickness is much thinner than the thickness at flat region. A rotating IBE process having a large angle is then conducted to mill away the side wall metal layer, as shown in FIG. 11. After that, an interlayer insulating film 119 is deposited to cover the entire surface, as shown in FIG. 12. The top surface is then flattened by conducting a CMP process to expose a surface of the top surface of the MTJ film. As shown in FIG. 13, a bit line 18 to be electrically connected to the MTJ stack is formed on the magnetoresistive element 30. The bit line 18 may be made of aluminum (Al) or copper (Cu), for example. Thus, a memory cell of the MRAM of the first embodiment is formed by the manufacturing method according to this embodiment.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spin-transfer torque magnetoresistive memory comprising at least one memory cell comprising:
    a digital line provided on a surface of a substrate serving as a bottom electrode; a dielectric functional layer provided on the top surface of the digital line layer;
    a magnetic soft adjacent layer provided on the top surface of the dielectric functional layer having a magnetic shape anisotropy along a first direction in a surface plane and an induced perpendicular anisotropy from a interface interaction with the functional layer and having a variable magnetization direction;
    a conductive layer provided on the top surface of the soft adjacent layer, serving as a middle electrode;
    a MTJ stack provided on the top surface of the conductive layer and overlaid above the conductive layer and magnetic soft adjacent layer;
    a bit line provided on the top surface of the MTJ stack;
    a CMOS transistor coupled the plurality of magnetoresistive memory elements through the middle electrode;
    the MTJ stack further comprises:
    a recording layer provided on the top surface of the conductive layer having a magnetic shape anisotropy along the first direction in a surface plane and having a variable magnetization direction and forming a flux closure with the soft adjacent layer;
    a tunnel barrier layer provided on the top surface of the recording;
    a reference layer on the top surface of the tunnel barrier layer having magnetic anisotropy along the first direction and invariable magnetization direction in a surface plane;
    a coupling spacing layer on the top surface of the reference layer;
    a pinned layer on the top surface of the coupling spacing layer having magnetic anisotropy along the first direction and invariable magnetization direction in a surface plane;
    an antiferromagnetic layer on the top surface of the pinned layer;
    a cap layer on the top surface of the antiferromagentic layer; and
    there is further provided a control circuitry coupled through the bit line, the digital line and the select transistor to selected ones of the plurality of magnetoresistive memory elements, configured to provide a bi-directional spin-transfer recording current between the bit line and the select transistor and to provide a negative voltage on the digital line to generate a electric field on the dielectric functional layer and pointing downwards along the thickness direction to enhance a perpendicular anisotropy in the soft adjacent layer in a recording operation, configured to provide a reading current between the bit line and the select transistor in a reading operation.

2. The element of claim 1, wherein said functional layer is made of a metal oxide, or nitride, or chloride layer having rocksalt crystal structure having the (100) plane parallel to the substrate plane and containing at least one element selected from Na, Li, Mg, Ca, Zn, Cd, In, Sn, Cu, Ag, preferred to be naturally stable rocksalt metal oxide or oxynitride selected from MgO, MgN, CaO, CaN, MgZnO, CdO, CdN, MgCdO, CdZnO.

3. The element of claim 1, wherein the thickness of said functional layer is preferred to be more than 1.5 nm and less than 10 nm.

4. The element of claim 1, wherein the perpendicular resistance of said functional layer is at least 500 ohms per square micron, preferred to be more than 5000 ohms per square micron.

5. The element of claim 1, wherein said conductive layer is made of a Ta layer having a thickness more than 1.5 nm and less than 10 nm.

6. The element of claim 1, wherein said conductive layer is made of a multilayer having a Ta sub-layer and having a thickness more than 1.5 nm and less than 10 nm, preferred to be Ta/Ru, Ta/Cu, Ta/Au, Ta/Ag.

7. The element of claim 1, wherein said soft adjacent layer is a ferromagnetic layer containing Boron, preferred to be CoFeB or CoB, the Boron composition percentage is preferred to be at least 5%.

8. The element of claim 1, wherein said soft adjacent layer is a multi-layer comprising a ferromagnetic sub-layers and optional nonmagnetic insertion sub-layers.

9. The element of claim 1, wherein said soft adjacent layer is a tri-layer comprising a first ferromagnetic layer containing Boron and immediately adjacent to said functional layer, preferred to be CoB, or CoFeB, the B composition percentage is preferred to be at least 5%, a second ferromagnetic layer, a optional insertion layer provided between the first ferromagnetic layer and the second ferromagnetic layer and containing at least one element selected from Ta, Hf, Zr, Ti, Mg, Nb, W, Mo, Ru, Al, Cu, Si and having a thickness less than 0.5 nm.

10. The element of claim 1, wherein the thickness of said soft adjacent layer is more than 1.6 nm and less than 10 nm.

11. The element of claim 1, wherein said soft adjacent has a perpendicular anisotropy less than its demag field in absent of any electric field.

12. The element of claim 1, wherein said soft adjacent has an enhanced perpendicular anisotropy slightly smaller, or equal to, or larger than the demag field as an electric field applied on the functional layer and pointing downwards along the thickness direction.

13. The element of claim 1, further comprising an optional intermediate layer between the digital line and the functional layer having amorphous or nano-crystal structure, preferred to be a layer containing Boron and at least one element from Co, Fe, Ni and having a thickness between 0.3 nm and 3 nm.

14. The element of claim 1, wherein said tunnel barrier layer is made of a metal oxide or a metal nitride, a metal oxynitride, preferred to be MgO, ZnO, MgZnO, MgN, MgON.

15. The element of claim 1, wherein said recording layer is a ferromagnetic layer having at least one element selected from Co, Fe, Ni.

16. The element of claim 1, wherein said digital line voltage in a recording operation is in the range of −0.5 to −1.8 volt.

17. The element of claim 1, wherein said digital line voltage in a reading operation is switched off or in a negative range between 0 and 1.8 volt.

* * * * *